(12) United States Patent
Jacob et al.

(10) Patent No.: US 6,731,529 B2
(45) Date of Patent: May 4, 2004

(54) VARIABLE CAPACITANCES FOR MEMORY CELLS WITHIN A CELL GROUP

(75) Inventors: Michael Jacob, Yokohama (JP); Joerg Wohlfahrt, Yokohama (JP); Norbert Rehm, Yokohama (JP); Daisaburo Takashima, Komukai Toshiba-cho (JP)

(73) Assignees: Infineon Technologies Aktiengesellschaft, Munich (DE); Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/161,907

(22) Filed: Jun. 4, 2002

(65) Prior Publication Data

US 2003/0223263 A1 Dec. 4, 2003

(51) Int. Cl.[7] ............................................. G11C 11/22
(52) U.S. Cl. .......................... 365/145; 365/63; 365/149
(58) Field of Search ................................ 365/145, 149, 365/63, 190, 202

(56) References Cited

U.S. PATENT DOCUMENTS

| | | | |
|---|---|---|---|
| 6,366,490 B1 | * | 4/2002 | Takeuchi et al. ............ 365/145 |
| 6,473,330 B1 | * | 10/2002 | Ogiwara et al. ............ 365/145 |
| 6,483,737 B2 | * | 11/2002 | Takeuchi et al. ............ 365/145 |
| 6,552,922 B2 | * | 4/2003 | Ogiwara et al. ............ 365/145 |

* cited by examiner

Primary Examiner—Gene Auduong
(74) Attorney, Agent, or Firm—Horizon IP Pte Ltd

(57) ABSTRACT

A memory chain with capacitors having different capacitances, depending on the location of the memory cell within the chain, is described. Varying the capacitances of the capacitors advantageously enables an effective capacitance for all memory cells within the chain to be about the same.

15 Claims, 4 Drawing Sheets

101

VARIABLE CAPACITANCES FOR MEMORY CELLS WITHIN A CELL GROUP

FIELD OF THE INVENTION

The present invention relates to chained architecture in memory integrated circuits (ICs). More particularly, the invention relates to ferroelectric memory ICs having a series or chained architecture.

BACKGROUND OF THE INVENTION

Ferroelectric metal oxide ceramic materials such as lead zirconate titanate (PZT) have been investigated for use in ferroelectric semiconductor memory devices. Other ferroelectric materials including strontium bismuth tantalate (SBT) can also be used. FIG. 1 shows a conventional ferroelectric capacitor 101. As shown, the capacitor comprises a ferroelectric metal ceramic layer 150 sandwiched between first and second electrodes 110 and 120. The electrodes typically are formed from a noble metal such as platinum. Other conductive materials, such as strontium ruthenium oxide (SRO), are also useful to form the electrodes. The ferroelectric capacitor uses the hysteresis polarization characteristics of the ferroelectric material for storing information. The logic value stored in the memory cell depends on the polarization of the ferroelectric capacitor. To change the polarization of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

FIG. 2 shows a schematic diagram of a group of memory cells 202 which, for example, is part of an IC. The group of memory cells comprises a plurality of ferroelectric memory cells $240_1$–$240_x$, each having a transistor 242 coupled to a ferroelectric storage capacitor 244 in parallel. The group of memory cells are coupled in series to form a memory chain. Chained memory architecture is described in, for example, Takashima et al., Symposium on VLSI Circuits (1997), which is herein incorporated by reference for all purposes. The gates of the transistors, for example, are gate conductors which either serve as wordlines or are coupled to wordlines of the memory array. A bitline 250 is coupled to a first end of the chain via a selection transistor 225 and a plateline 260 is coupled to a second end of the chain.

To read data from a memory cell of a memory chain, the selection transistor of the selected memory chain is activated or rendered conductive, coupling the selected memory chain to the bitline. In addition, a pulse is provided on the plateline and all transistors except the one associated with the selected memory cell of the chain is kept active. A charge stored in the selected memory cell is transferred to the bitline. This signal is compared to a reference signal by a sense amplifier.

However, the charge in the selected capacitor is shared by the sum of the bitline capacitance 230 and total parasitic capacitances 248 of the memory cells between it and the bitline. For example, if memory cell $240_3$ is selected, the charge in capacitor $244_3$ is shared by the sum of the bitline capacitance and the parasitic capacitances ("load") of memory cells $240_1$ and $240_2$. The load capacitance for a memory cell varies depending on the position of the memory cell within the chain, creating a load imbalance. Cells closer to the bitline have smaller load capacitances compared to those farther away. Such imbalance causes a variation in the bitline signal depending on the memory cell selected, which is undesirable as this reduces the sensing window of the sense amplifier.

From the foregoing discussion, it is desirable to provide a chained architecture which avoids the adverse effects of the intrinsic load imbalance.

SUMMARY OF THE INVENTION

The invention relates to integrated circuits with chained memory architectures having, for example, ferroelectric memory cells. In accordance with the invention, the capacitors of the memory cells within a chain have different capacitances to compensate for the intrinsic load differences experienced by the different memory cells. This enables all the memory cells of the chain to have an effective capacitance which is about the same, thereby increasing sensing window which results in increased yield and performance.

DETAILED DESCRIPTION OF THE INVENTION

Figure 1:
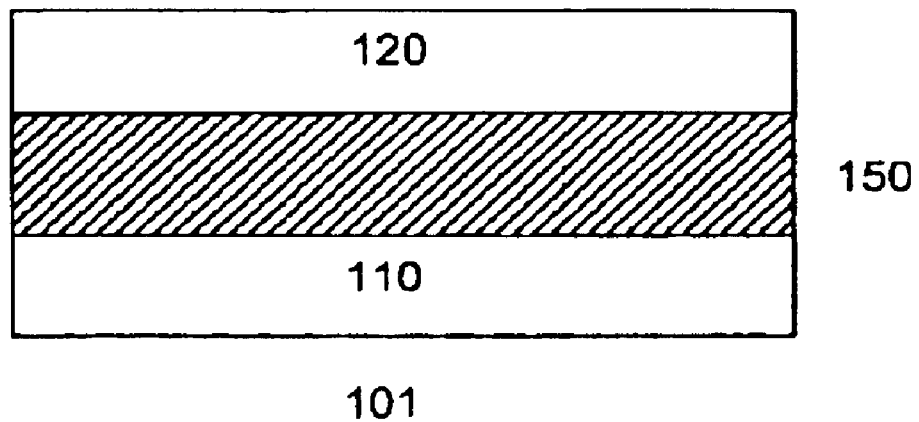
FIG. 1 shows a conventional ferroelectric capacitor.
Figure 2:
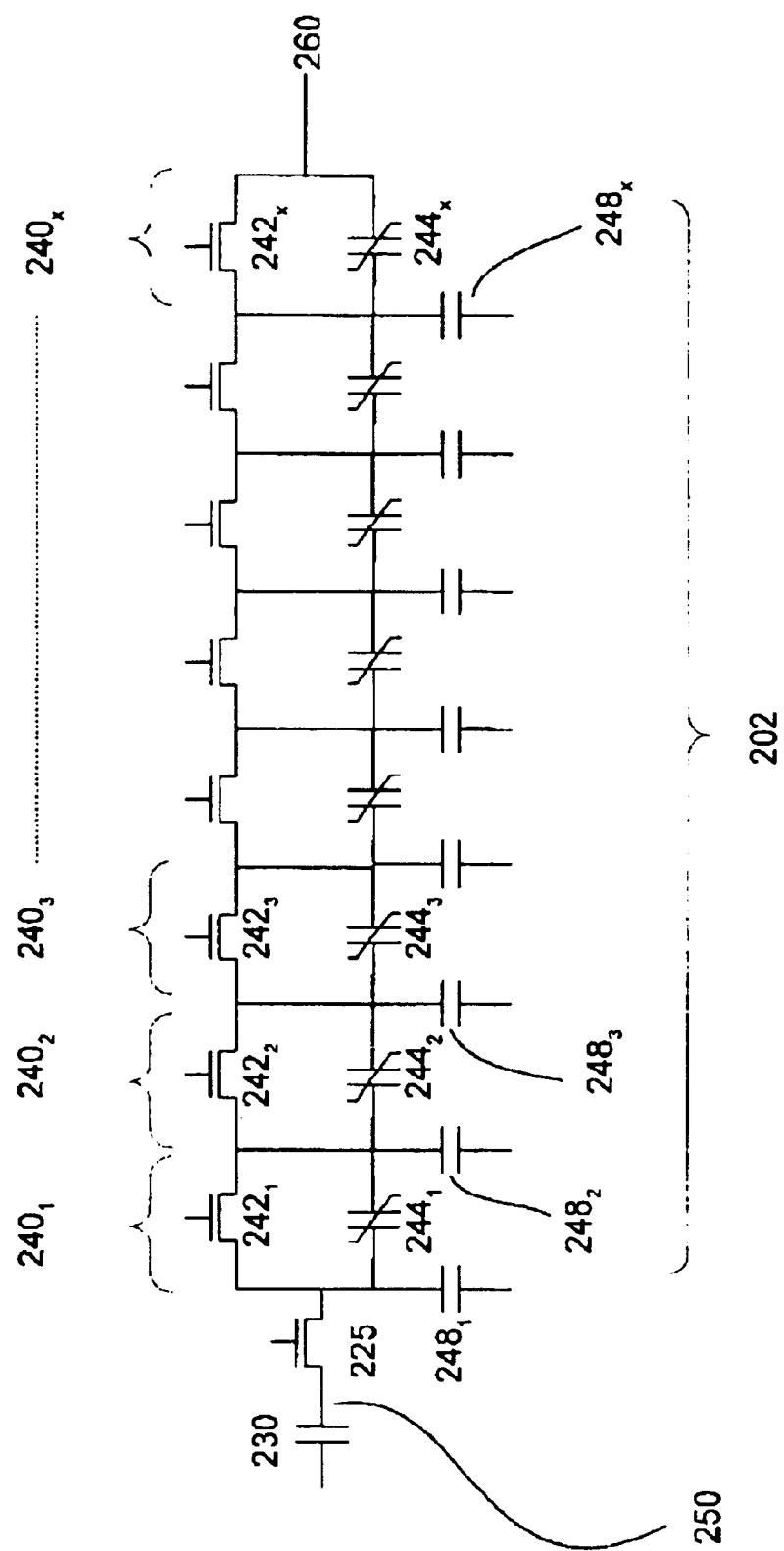
FIG. 2 shows a chain of memory cells in a conventional chained architecture.
Figure 3:
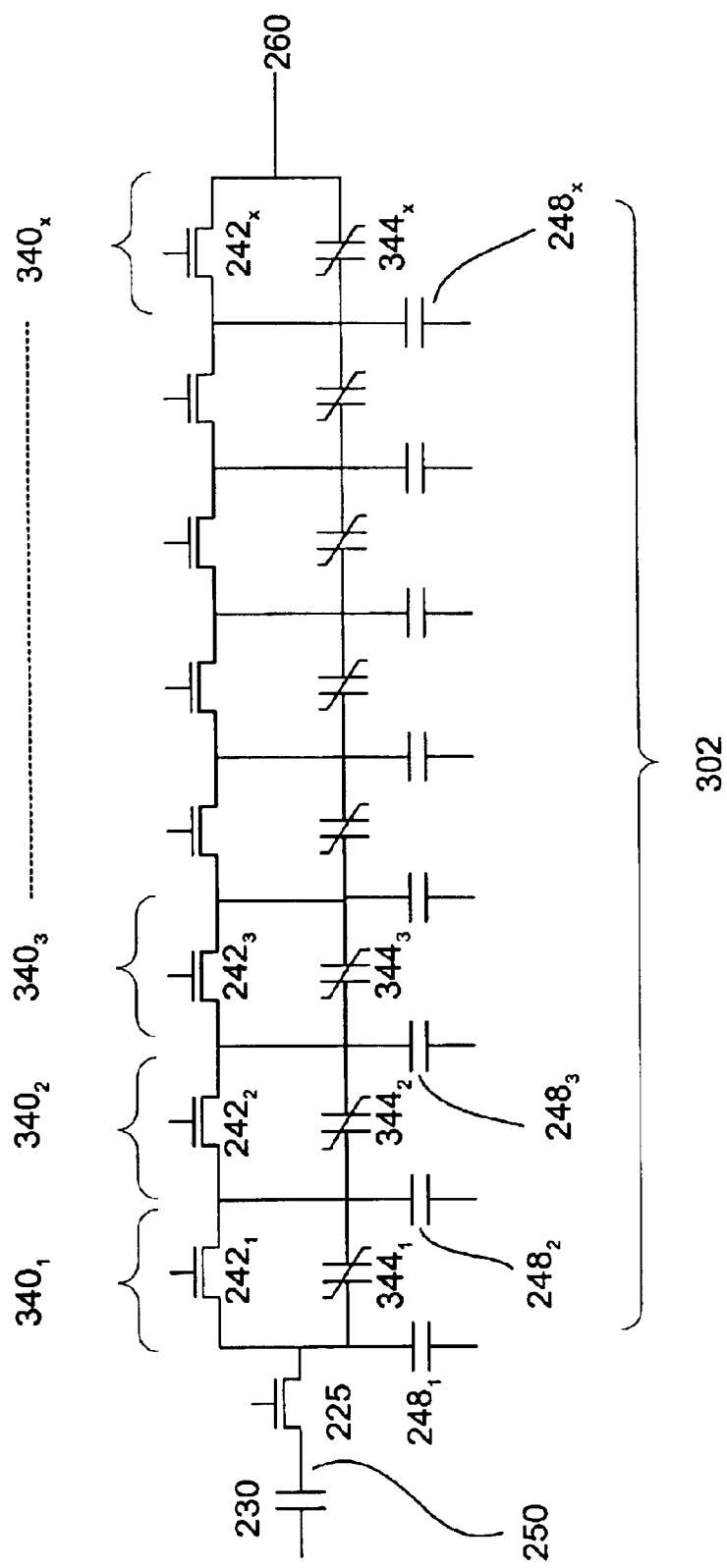
FIG. 3 shows a chain of memory cells in accordance with one embodiment of the invention.

FIG. 3 shows a plurality of memory cells $340_1$–$340_x$ in accordance with one embodiment of the invention. In one embodiment, the memory cells are ferroelectric memory cells. Other types of memory cells, such as dynamic random access memory (DRAM) cells, are also useful. A ferroelectric memory cell, as shown, includes a transistor coupled to a ferroelectric capacitor in parallel. The transistor, for example, is an n-FET. Other types of transistors, such as p-FETs, are also useful. The memory cells are coupled in series to form a memory chain 302.

One end of the chain is coupled to a bitline 250 via a selection transistor 225, such as an n-FET, while the other end is coupled to a plateline 260. As previously described, memory cells in different parts of the chain have different effective capacitances due to different capacitive loads which result from the intrinsic imbalance that exists in a chained architecture. As defined herein, effective capacitance is equal to the capacitance of the selected memory cell divided by the total capacitive load, where the total capacitive load is equal to sum of the bitline capacitance and the total parasitic capacitance of all the memory cells between the selected memory cell and the bitline.

In accordance with one embodiment of the invention, capacitors of memory cells within the chain have different capacitances. The capacitances of the different memory cell capacitors are selected to compensate for the load imbalance of the chain. The capacitance of a cell capacitor depends on its position within the chain. For example, memory cell capacitors farther away from the bitline end of the chain will have greater capacitances than those cells that are closer. In one embodiment, the capacitance of a memory cell is determined by equation 1 as follows:

$$\frac{C_{cellq}}{C} = \frac{C_{cellq}}{C_{BL} + \sum_{i=1}^{q} C_{pi}} = C_K$$

$C_{cellq}$: capacitance of ferroelectric capacitor of a memory cell within the chain, where q defines the location of the cell within the chain C: capacitive load of the memory $\text{cell}_q$, which is equal to the bitline capacitance ($C_{BL}$) plus the total sum of the parasitic capacitance of the memory $\text{cell}_q$ and all memory cells between it and the bitline (e.g., $\text{cell}_1$ to $\text{cell}_{q-1}$).

$C_K$: desired effective capacitance of any memory cell within the chain

It is understood that not all the memory cell capacitors of the chain necessarily have different capacitances. For example, the memory cells of the chain can be divided into groups of one or more memory cells. It is further understood that the different groups do not need to be of the same size. The different memory cell capacitors of the different groups can have different capacitances. For example, the capacitance of the cell capacitors of each group can be selected such that the effective capacitance of the cell is within a desired range of effective capacitance $C_k$.

Figure 4:
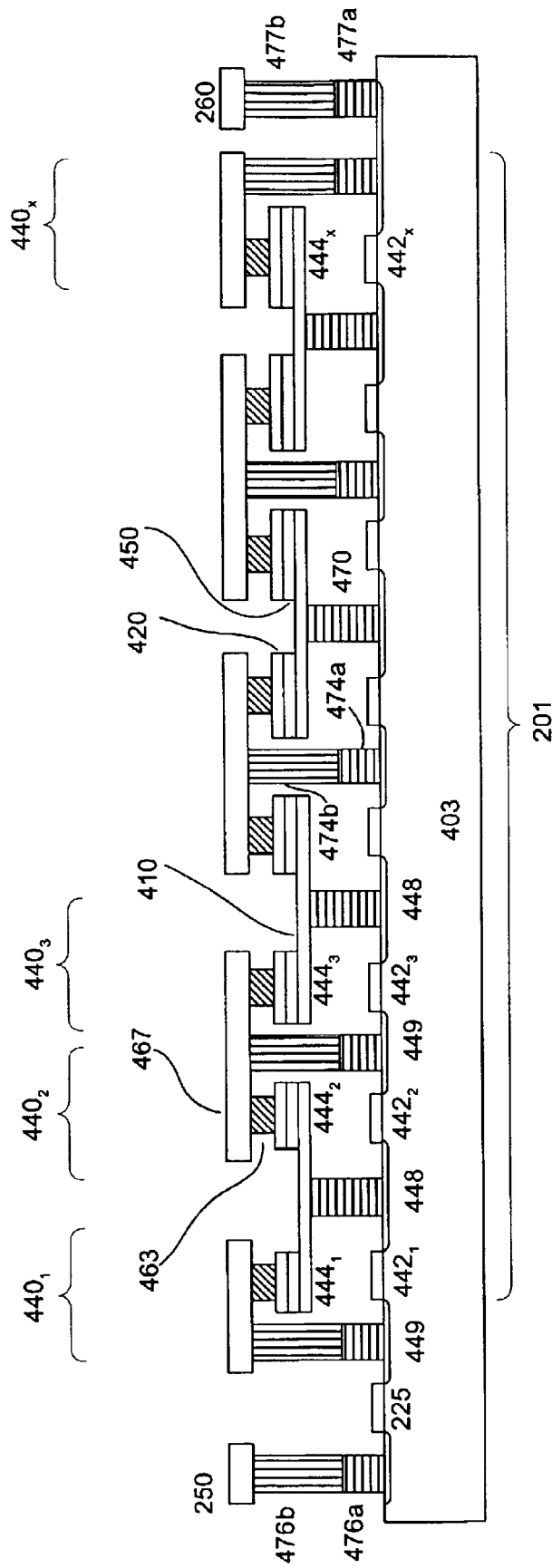
FIG. 4 shows a cross-section view of a memory chain in accordance with one embodiment of the invention.

FIG. 4 shows a cross-sectional view of a memory chain 201 in accordance with one embodiment of the invention. As shown, the chain is formed on a semiconductor substrate 403. Other types of semiconductor substrates can also be used. The memory chain comprises, for example, eight memory cells $440_1$–$440_x$ (i.e., x=8). Memory chains of other sizes are also useful. Preferably, the number of cells in a chain is equal to $2^y$, where y is a whole number $\geq 1$. Each memory cell comprises a transistor 442 coupled to a capacitor 444. In one embodiment, the memory cells are ferroelectric memory cells. Other types of memory cells are also useful. The ferroelectric memory cell includes, for example, an n-FET coupled to a stack ferroelectric capacitor with a ferroelectric layer between top and bottom electrodes. Other types of transistors (e.g., p-FETs) or capacitors (e.g., trench) are also useful. The gates of the transistors can be formed as gate conductors that either are coupled to or serve as wordlines. Numerous chains can be addressed by the wordlines, forming a memory block or array.

In one embodiment, the transistors of the memory cells within the chain share a diffusion region. Sharing of the diffusion region advantageously reduces surface area required. The capacitors of adjacent memory cells are interconnected. As shown, the two adjacent capacitors share a common electrode 410 to form a capacitor pair. Two non-common electrodes 420 of adjacent capacitors from adjacent capacitor pairs are coupled to a coupling interconnect 467 via studs 463. Preferably, the common electrode is the lower electrode while the non-common electrode is the upper electrode. A first common diffusion region 448 of a memory cell transistor is coupled to the common electrode of a capacitor pair via a contact stud 470 and the coupling interconnect is coupled to a second common diffusion region 449 via contact stud 474.

A selection transistor 225 is provided at a first end of the chain. In one embodiment, the selection transistor shares a common diffusion region with the transistor $442_1$ of memory cell $440_1$. The non-common diffusion region of the selection transistor is coupled to a bitline 250 via a contact 476 while the common diffusion region is coupled to the non-common electrode of capacitor $444_1$ of memory cell $440_1$. A plateline 260 is coupled to the other end of the chain. In one embodiment, the plateline is coupled to the non-common diffusion region of the transistor of the last memory cell $440_x$ of the chain via a contact 477.

Illustratively, the taller studs (e.g., 474, 476, and 477) are formed in two process steps. The first step forms lower portion (e.g., 474a, 476a, and 477a) and a second process step forms the upper portion (e.g., 474b, 476b, and 477b). Forming such studs using a single process step is also useful. Additionally, contact studs 470 and 474 can be formed using two separate processes. This enables the different contacts to be optimized individually. Alternatively, the lower portion 474a of contact studs 474 can be formed with contact studs 470. Other integration schemes for forming the contact studs are also useful.

In accordance with the invention, the capacitors of the memory cell have different capacitances, depending on the position of the memory cell within the chain, to compensate for load imbalance of the chain. In one embodiment, the capacitance of a memory cell is determined by equation 1 described above. The different capacitances can be achieved by varying the size of the capacitor (e.g., surface area). The larger the capacitor, the higher the capacitance and vice-versa. Other techniques for varying the capacitance of the capacitor, such as varying the distance of the electrodes, using different material composition for different capacitors or a combination of different techniques, are also useful.

In one embodiment, the capacitors towards the plateline end of the chain are larger than those closer to the bitline end of the chain since the load is larger at the plateline end than at the bitline end. Preferably, the sizes of the capacitors produce an effective capacitance which is the same for all capacitors. Alternatively, the cells can be grouped into one or more cells, wherein the cell capacitors of each group having different capacitances. The capacitance of the cell capacitors within each group is selected such that the effective capacitance of the cell is within a desired range of $C_K$. The IC may include additional features (not shown), such as support logic, passivation layers, and package.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An IC comprising:
   a plurality of memory cells, wherein a memory cell includes a capacitor coupled to a transistor in parallel, the plurality of memory cells coupled in series to form a group having first and second ends;
   a bitline coupled to the first end of the group; and
   wherein the capacitors of the different memory cells in the group are designed to have different capacitances to compensate for the different loads experienced by different memory cells within the group.

2. The IC of claim 1 wherein the capacitances of the memory cells depend on the location of the memory cell within the chain.

3. The IC of claim 1 wherein the capacitors located farther away from the first end are greater than those capacitors that are closer.

4. The IC of claim 1 wherein the group comprises $2^x$ memory cells wherein x is a whole number $\geq 1$.

5. The IC of claim 1, 2, 3, or 4 wherein the capacitances are determined by the equation $C_{cellq}/C = C_{cellq}/C_{BL}$+sum of $C_{pi}$ (where i=1 to q)=$C_K$, where $C_K$ is equal to the desired effective capacitance.

6. The IC of claim 5 wherein the capacitances are varied by changing the surface area of the capacitors.

7. The IC of claim 5 further comprises a plateline coupled to the second end.

8. The IC of claim 5 wherein the capacitors are ferroelectric capacitors.

9. An IC comprising:
   a plurality of memory cells, wherein a memory cell includes a capacitor coupled to a transistor in parallel, the plurality of memory cells coupled in series to form a group having first and second ends;
   a bitline coupled to the first end of the group; and
   wherein the memory cells in the group are divided into subgroups having one or more cells wherein different subgroups can have the same or different number of cells, the capacitors of the different subgroups are designed to have different capacitances to compensate for the different loads experienced by the memory cells of the different subgroups within the group.

10. The IC of claim 9 wherein the capacitances of the memory cells of the different subgroups depend on the locations of the subgroups within the group.

11. The IC of claim 9 wherein the capacitors of the subgroups located farther away from the first end are greater than those capacitors of the subgroups that are located closer.

12. The IC of claim 9, 10, or 11 wherein the capacitances within a subgroup are determined by the equation $C_{cellq}/C = C_{cellq}/C_{BL}$+sum of $C_{pi}$ (where i=1 to q)=$C_K$ where $C_K$ is equal to the desired effective capacitance.

13. The IC of claim 12 wherein the capacitances are varied by changing the surface area of the capacitors.

14. The IC of claim 12 wherein the capacitors are ferroelectric capacitors.

15. The IC of claim 14 wherein the capacitances are varied by changing the surface area of the capacitors.

* * * * *